United States Patent
Matsumaru (10) Patent No.: US 11,095,019 B2
(45) Date of Patent: Aug. 17, 2021

(54) RADIO COMMUNICATION DEVICE AND BOARD

(71) Applicant: FUJIKURA LTD., Tokyo (JP)

(72) Inventor: Kohei Matsumaru, Sakura (JP)

(73) Assignee: FUJIKURA LTD., Tokyo (JP)

( * ) Notice: Subject to any disclaimer, the term of this patent is extended or adjusted under 35 U.S.C. 154(b) by 100 days.

(21) Appl. No.: 16/605,344

(22) PCT Filed: Jan. 26, 2018

(86) PCT No.: PCT/JP2018/002527
§ 371 (c)(1),
(2) Date: Oct. 15, 2019

(87) PCT Pub. No.: WO2018/193682
PCT Pub. Date: Oct. 25, 2018

(65) Prior Publication Data
US 2021/0126350 A1    Apr. 29, 2021

(30) Foreign Application Priority Data

Apr. 20, 2017    (JP) .............................. JP2017-083719

(51) Int. Cl.
*H04B 1/40*    (2015.01)
*H01Q 1/10*    (2006.01)
(Continued)

(52) U.S. Cl.
CPC .............. *H01Q 1/246* (2013.01); *H01P 3/081* (2013.01); *H01Q 19/19* (2013.01); *H04W 88/08* (2013.01); *H05K 7/2039* (2013.01)

(58) Field of Classification Search
CPC .......... H01Q 1/00; H01Q 19/10; H01Q 1/246; H01R 13/62; H04B 1/40; H01P 3/08; H01P 3/081; H04W 88/08
See application file for complete search history.

(56) References Cited

U.S. PATENT DOCUMENTS 8,674,885 B2 * 3/2014 Leiba .................. H01Q 1/48
343/702
8,674,892 B2 * 3/2014 Lei ba .................. H01Q 13/106
343/755
(Continued)

FOREIGN PATENT DOCUMENTS

EP    1737065 A1    12/2006
EP    2330683 A1    6/2011
(Continued)

OTHER PUBLICATIONS

International Search Report dated Oct. 4, 2018, issued in counterpart application No. PCT/JP2018/002527 (2 pages).
(Continued)

*Primary Examiner* — Blane J Jackson
(74) *Attorney, Agent, or Firm* — Westerman, Hattori, Daniels & Adrian, LLP (57) ABSTRACT

In a radio communication device which employs a millimeter wave, a contact failure which can occur in a case where maintenance is repeatedly carried out is suppressed. A radio communication device (1) includes: a first substrate (11) which includes a radio communication circuit (RFIC 12) that processes a high frequency signal; and a second substrate (21) which includes a baseband circuit (baseband IC 22) that processes the baseband signal. A terminal (14d) to which the baseband signal is supplied from the second substrate (21) is provided in a vicinity of an edge (11a) of the first substrate (11), and the second substrate (21) includes a card-edge connector (23) which supplies the baseband signal to the terminal (14d).

5 Claims, 4 Drawing Sheets (51) Int. Cl.
    *H01P 3/08*     (2006.01)
    *H01Q 1/24*     (2006.01)
    *H01Q 19/19*     (2006.01)
    *H04W 88/08*     (2009.01)
    *H05K 7/20*     (2006.01)

(56) References Cited

U.S. PATENT DOCUMENTS

| | | | | |
|---|---|---|---|---|
| 8,941,013 | B2* | 1/2015 | Arnold | H01R 12/732 |
| | | | | 174/258 |
| 2011/0057741 | A1* | 3/2011 | Dayan | H01P 5/107 |
| | | | | 333/26 |
| 2012/0050125 | A1* | 3/2012 | Leiba | H01Q 9/0407 |
| | | | | 343/834 |
| 2013/0010848 | A1 | 1/2013 | Shimizu et al. | |

FOREIGN PATENT DOCUMENTS

| | | |
|---|---|---|
| JP | 2007-006471 A | 1/2007 |
| JP | 2011-199613 A | 10/2011 |
| JP | 2012-080353 A | 4/2012 |
| JP | 2015-177423 A | 10/2015 |
| WO | 2006064536 A1 | 6/2006 |
| WO | 2013/190442 A1 | 12/2013 |

OTHER PUBLICATIONS

Notification of Transmittal of Translation of the International Preliminary Report on Patentability of International Application No. PCT/JP2018/002527 dated Oct. 4, 2018 with Form PCT/ISA/237 (11 pages).

* cited by examiner

RADIO COMMUNICATION DEVICE AND BOARD

TECHNICAL FIELD

The present invention relates to a radio communication device. The present invention further relates to a substrate which is included in the radio communication device and on which a radio communication circuit that makes a conversion between a high frequency signal in a millimeter wave band and a baseband signal is mounted.

BACKGROUND ART

An optical fiber has been in wide use as a transmission medium for establishing a high-speed communication network through which a large volume of data can be transmitted at a high speed. However, there has been a demand for a technique of establishing a high-speed communication network with use of a transmission medium other than an optical fiber, depending on diversity of a region in which the high-speed communication network is to be established. In recent years, as such a radio communication device which employs a transmission medium other than an optical fiber, a radio communication device which employs a radio wave in a millimeter wave band as a transmission medium has drawn attention. A radio communication device which employs a millimeter wave is used, for example, as a base station in a town which base station is called a small cell or as an access point.

FIG. 31 of Patent Literature 1 illustrates a radio communication device (millimeter-wave communication system) which employs a millimeter wave. The radio communication device includes an antenna, a first printed circuit board (PCB), a second printed circuit board, and at least one cable.

The antenna includes a reflector and a feed. The first printed circuit board includes a radio receiver, and is connected to one end of the feed. The radio receiver receives a radio wave in a millimeter wave band, which radio wave has been received by the antenna, and generates a baseband signal from the radio wave. The cable is flexible, and the first printed circuit board and the second printed circuit board are connected to each other via the cable. The baseband signal generated by the radio receiver is transmitted from the first printed circuit board to the second printed circuit board via the cable together with a control signal. Note that, in a case where the first printed circuit board and the second printed circuit board are not particularly distinguished, the first printed circuit board and the second printed circuit board will be each referred to as merely a printed circuit board.

CITATION LIST

Patent Literature

[Patent Literature 1]
Specification of US Patent Application Publication No. 2012/0050125 (published on Mar. 1, 2012)

SUMMARY OF INVENTION

Technical Problem

The radio communication device illustrated in FIG. 31 of Patent Literature 1 consumes a larger amount of electric power and generates a larger amount of heat than a radio communication device which employs a radio wave having a frequency lower than that of the millimeter wave (for example, microwave). Particularly, since the radio receiver generates the baseband signal from the millimeter wave, the radio receiver generates a larger amount of heat than the other components of the radio communication device. Therefore, the radio communication device, particularly, the first printed circuit board, which includes the radio receiver, has a high risk of a failure caused by high heat.

Moreover, in a case where the radio communication device which employs the millimeter wave is used as, for example, a base station or an access point, it is assumed that the radio communication device is placed in an environment in which a temperature change, a humidity change, or the like is drastic. Such a severe environment further increases a risk of a failure in the radio communication device.

For the above reasons, in a case where the radio communication device which employs the millimeter wave is used, it is required to (i) inspect the radio communication device in order to prevent a failure and (ii) repair the radio communication device in a case where a failure occurs. Hereinafter, such an inspection and repair will be collectively referred to as maintenance.

In a case where a regular inspection or repair is carried out with respect to the radio communication device illustrated in FIG. 31 of Patent Literature 1, it is necessary to detach and attach the cable, via which the first printed circuit board and the second printed circuit board are connected to each other, in order to carry out such maintenance.

The cable used in the radio communication device which employs the millimeter wave is fixed to the printed circuit board with use of a coaxial connector such as an N-connector or an SMA-connector. The coaxial connector is made up of a male connector and a female connector. The male connector and the female connector are engaged with or disengaged from each other by rotating one of those connectors clockwise or counterclockwise on a central axis, serving as a rotation axis, of the coaxial connector. Therefore, external force acting in a direction of rotation is applied to a printed-circuit-board side connector. This ultimately causes a stress acting in the direction of the rotation to be applied to a junction between the printed circuit board and the printed-circuit-board side connector.

The printed circuit board and the printed-circuit-board side connector are joined to each other with use of solder. Therefore, in a case where the stress acting in the direction of the rotation is applied to the junction a plurality of times, a crack runs in the solder or the solder and the printed circuit board or the solder and the printed-circuit-board side connector are separated from each other. As a result, a contact failure may occur between the cable and the printed circuit board.

A radio communication device in accordance with an aspect of the present invention has been made in view of the above problem, and an object is to suppress a contact failure which can occur in a case where maintenance is repeatedly carried out with respect to a radio communication device which employs a millimeter wave.

Solution to Problem

In order to attain the above object, a radio communication device in accordance with an aspect of the present invention is a radio communication device including: a first substrate whose base material is a dielectric material and on which a radio communication circuit is provided, the radio communication circuit being a circuit for making a conversion between (i) a high frequency signal in a millimeter wave band and (ii) a baseband signal having a frequency lower than that of the high frequency signal; and a second substrate on which a baseband circuit for processing the baseband signal is provided, at least a halfway part of the first substrate being flexible, the first substrate including: a terminal which is provided in a vicinity of an edge of the first substrate and to which the baseband signal is supplied from the second substrate; and a transmission line through which the baseband signal is transmitted from the terminal to the radio communication circuit, the second substrate including a card-edge connector which is electrically connected to the baseband circuit and which supplies the baseband signal to the terminal.

In order to attain the above object, a substrate in accordance with an aspect of the present invention is a substrate whose base material is a dielectric material, at least a halfway part of the substrate being flexible, on the substrate a radio communication circuit being provided for making a conversion between (i) a high frequency signal in a millimeter wave band and (ii) a baseband signal having a frequency lower than that of the high frequency signal, the substrate including (i) a terminal which is provided in a vicinity of an edge of the substrate and to which the baseband signal is externally supplied and (ii) a transmission line through which the baseband signal is transmitted from the terminal to the radio communication circuit.

Advantageous Effects of Invention

A radio communication device in accordance with an aspect of the present invention is a radio communication device which employs a millimeter wave, and makes it possible to suppress a contact failure which can occur in a case where maintenance is repeatedly carried out. A substrate in accordance with an aspect of the present invention brings about an effect similar to that brought about by the radio communication device in accordance with an aspect of the present invention.

BRIEF DESCRIPTION OF DRAWINGS (a) of FIG. 1 is a cross-sectional view of a radio communication device in accordance with Embodiment 1 of the present invention. (b) of FIG. 1 is an enlarged cross-sectional view of a radio communication circuit, included in the radio communication device illustrated in (a) of FIG. 1, and a vicinity of the radio communication circuit.

(a) of FIG. 2 is an exploded perspective view of a first substrate and a card-edge connector of a second substrate, each included in the radio communication device illustrated in (a) of FIG. 1. (b) of FIG. 2 is a cross-sectional view of the first substrate and the card-edge connector of the second substrate.

(a) of FIG. 5 is a perspective view of a substrate in accordance with Embodiment 2 of the present invention. (b) of FIG. 5 is a cross-sectional view of the substrate illustrated in (a) of FIG. 5.

DESCRIPTION OF EMBODIMENTS

Embodiment 1

Figure 1:
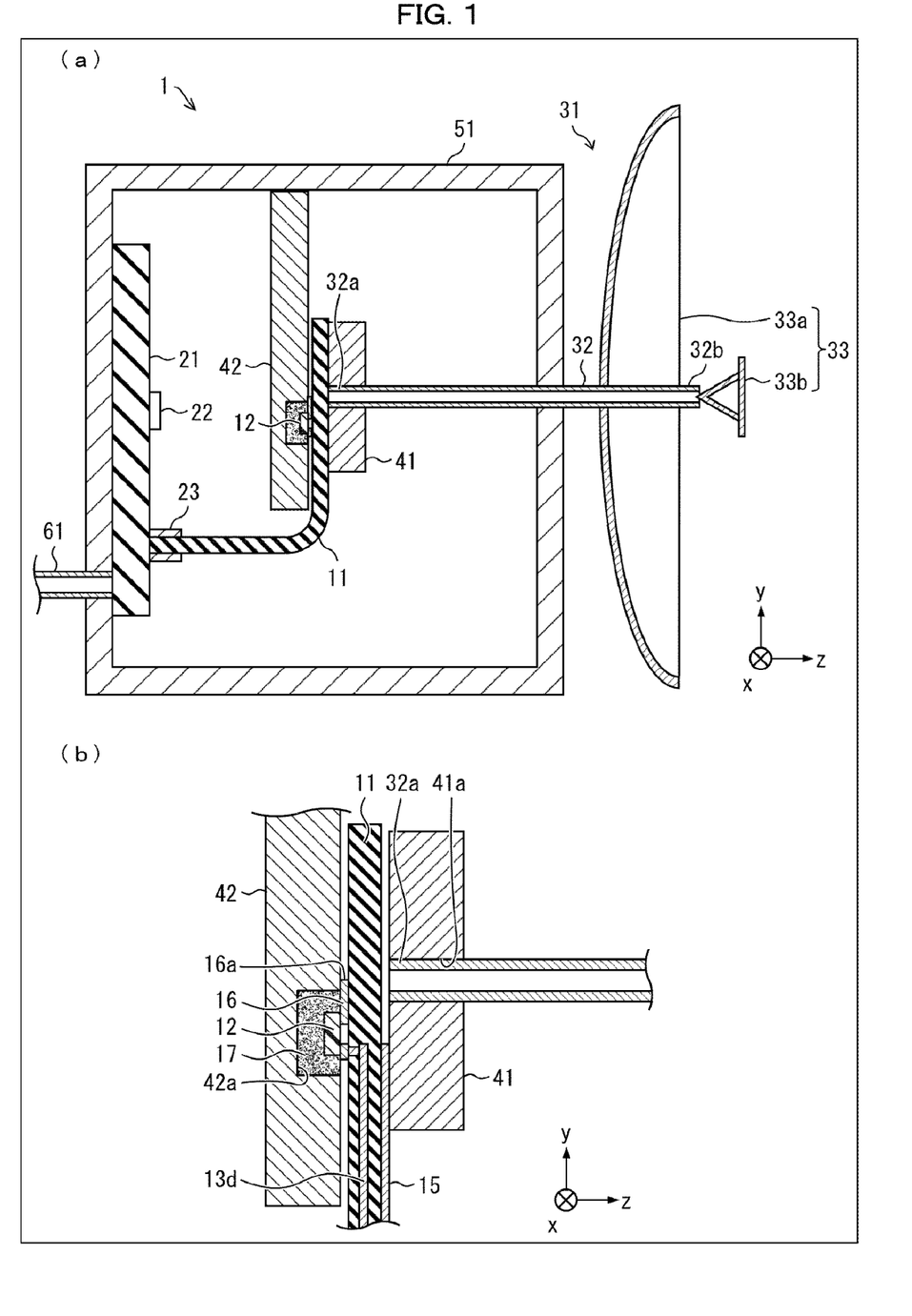
Figure 2:
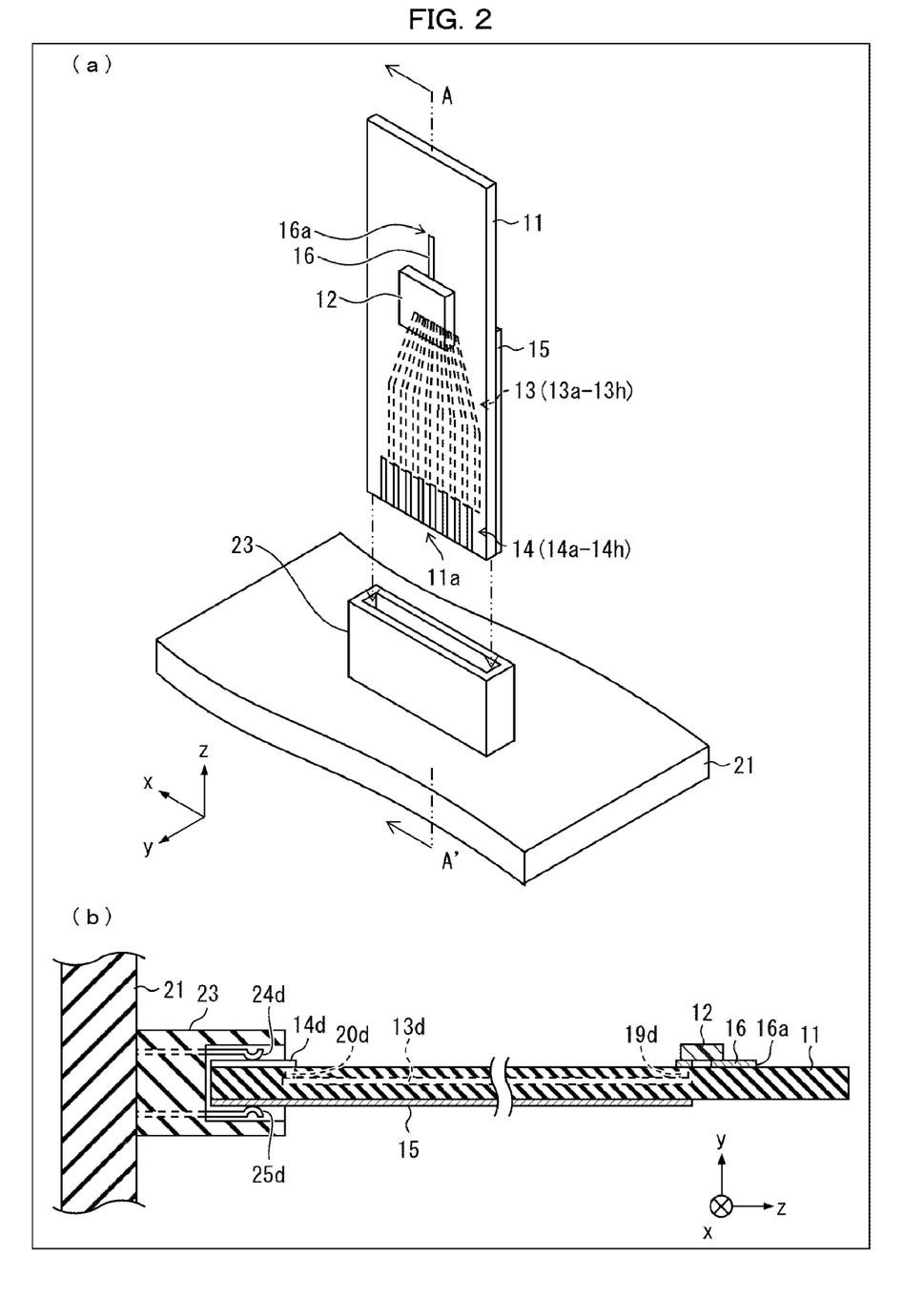
Figure 3:
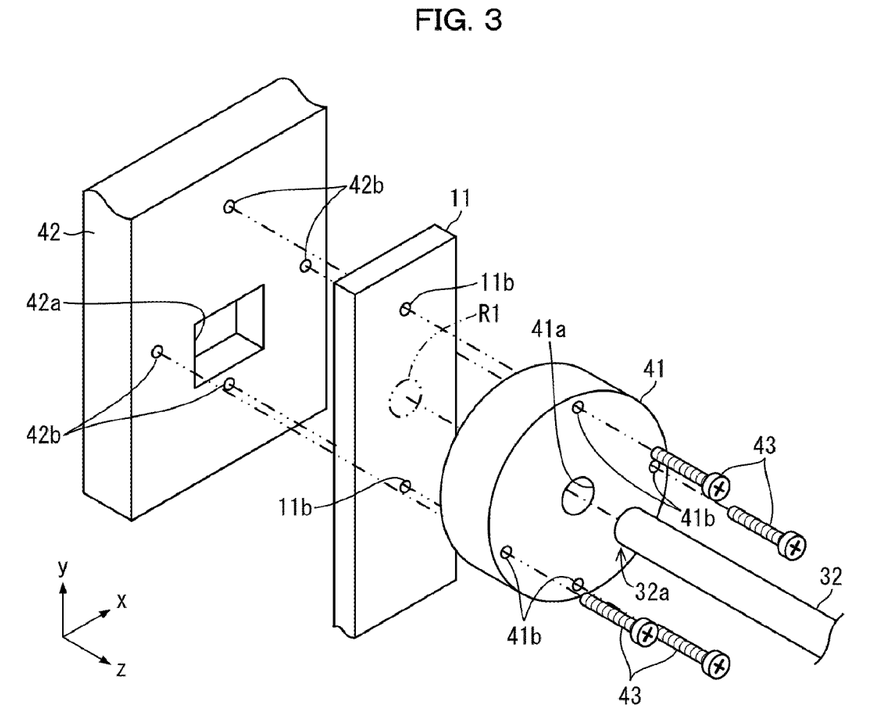
FIG. 3 is an exploded perspective view of the first substrate, a first metal member, a second metal member, and a waveguide, each included in the radio communication device illustrated in (a) of FIG. 1.

A radio communication device in accordance with Embodiment 1 of the present invention will be described below with reference to FIGS. 1 through 3. (a) of FIG. 1 is a cross-sectional view of a radio communication device 1 in accordance with Embodiment 1. (b) of FIG. 1 is an enlarged cross-sectional view of an RFIC 12, included in the radio communication device 1, and a vicinity of the RFIC 12. (a) of FIG. 2 is an exploded perspective view of a substrate 11 and a card-edge connector 23 of a substrate 21, each included in the radio communication device 1. (b) of FIG. 2 is a cross-sectional view of the substrate 11 and the card-edge connector 23 of the substrate 21. (b) of FIG. 2 illustrates a cross-sectional view taken from a line A-A' illustrated in (a) of FIG. 2. FIG. 3 is an exploded perspective view of the substrate 11, a thermal diffusion plate 41, a thermal diffusion plate 42, and a waveguide 32, each included in the radio communication device 1.

The radio communication device 1 includes the substrate 11, the substrate 21, an antenna 31, the thermal diffusion plate 41, the thermal diffusion plate 42, a housing 51, and a waveguide 61. The substrate 11 corresponds to a "first substrate" recited in Claims. The substrate 21 corresponds to a "second substrate" recited in Claims. The thermal diffusion plate 41 corresponds to a "first metal member" recited in Claims. The thermal diffusion plate 42 corresponds to a "second metal member" recited in Claims.

(Antenna 31)

The antenna 31 includes the waveguide 32 and a reflector 33. A probe 16 and the radio frequency (RF) integrated circuit (IC) 12 are provided (mounted) on a first surface of the substrate 11 which first surface is opposite to a second surface of the substrate 11 which second surface faces the antenna 31 (hereinafter, the first surface will be referred to as a "first main surface of the substrate 11"). The RFIC 12 corresponds to a "radio communication circuit" recited in Claims. Furthermore, a signal line group 13 and a ground layer 15, which correspond to a "transmission line" recited in Claims, are provided to the substrate 11. The signal line group 13 is made up of signal lines 13a through 13h. A card-edge connector terminal group 14, which corresponds to a "terminal" recited in Claims, is provided in a vicinity of an edge 11a, which is located closest to the substrate 21, of the substrate 11. The card-edge connector terminal group 14 is made up of terminals 14a through 14h. There are provided (mounted), on a surface of the substrate 21, (i) a baseband IC 22 which corresponds to a "baseband circuit" recited in Claims and (ii) the card-edge connector 23. There are further provided, on the substrate 21, a plurality of transmission lines (not illustrated) each functioning as a path along which a signal is transmitted.

The waveguide 32 is a tubular member having open ends, and a tubular wall of the waveguide 32 is made of an electric conductor such as metal. A cavity inside the waveguide 32 can be filled with air or can be alternatively filled with a dielectric other than air. Embodiment 1 employs a configuration in which the cavity is filled with air. The cavity functions as a waveguide through which an electromagnetic wave is guided. An end part 32a of the waveguide 32 is located close to the second surface of the substrate 11 which second surface faces the antenna 31 (hereinafter, the second surface will be referred to as a "second main surface of the substrate 11"), and is electromagnetically coupled to a leading end 16a of the probe 16. Note that the end part 32a is one of end parts of the waveguide 32.

The reflector 33 is made up of a main reflector 33a and a sub-reflector 33b. The sub-reflector 33b is made of a reflecting plate. The reflecting plate can have any shape. Embodiment 1 employs an external shape in the form of a cone. The main reflector 33a and the sub-reflector 33b of the reflector 33 are configured such that, for example, electromagnetic waves are converged on a given focal point (for example, an apex of the cone). The apex of the cone is fixed to an end part 32b of the waveguide 32 so that the end part 32b is electromagnetically coupled to the reflector 33. Note that the end part 32b is the other of the end parts of the waveguide 32.

(Substrate 11)

The substrate 11, whose base material is a dielectric material having a strip shape, is so-called flexible printed circuits (FPC, also referred to as a flexible substrate) in which at least a halfway part thereof is flexible. The halfway part indicates part or the whole (indicates the whole, in Embodiment 1) of a part of the substrate 11 which part is located between (i) a region in which the RFIC 12 is provided and (ii) a region in which the card-edge connector terminal group 14 is provided. In other words, the halfway part indicates part or the whole of a part of the substrate 11 to which part the signal line group 13 is provided. The dielectric material can be selected, as appropriate, in consideration of its specific inductive capacity and the like. Examples of the dielectric material include liquid crystal polymers (LCP) and polyimide resins. Note that the substrate 11 can be merely made of a single dielectric material or can be alternatively made of a plurality of dielectric materials in combination.

The RFIC 12 converts a baseband signal into a high frequency signal or converts a high frequency signal into a baseband signal. Specifically, in a case where the radio communication device 1 is intended to function as a radio transmitter, the RFIC 12 converts a baseband signal into a high frequency signal. In a case where the radio communication device 1 is intended to function as a radio receiver, the RFIC 12 converts a high frequency signal into a baseband signal. Note that the radio communication device 1 can be a radio transmitter, a radio receiver, or a radio transmitter-receiver. In a case where the radio communication device 1 is intended to function as a radio transmitter-receiver, the RFIC 12 can employ, for example, time-division multiplexing.

Note that, according to the radio communication device 1, a band of a high frequency signal is a millimeter wave band. A band of a baseband signal is a band, such as a microwave band, which is lower in frequency than the millimeter wave band.

The probe 16 is a strip-shaped electric conductor which is connected to one of ports of the RFIC 12 at which one of the ports a high frequency signal is coupled. The probe 16 is provided so that its leading end 16a is electromagnetically coupled to the end part 32a of the waveguide 32. With the configuration, a part, in which the leading end 16a is electromagnetically coupled to the end part 32a, functions as a converting section which makes a conversion between (i) a mode of a high frequency signal which is transmitted through the probe 16 and (ii) a mode of the high frequency signal which is transmitted through the waveguide 32. Therefore, on the substrate 11, the probe 16 functions as a feed line through which a high frequency signal is fed to the antenna 31.

The signal line group 13 is made up of a plurality of signal lines, that is, the signal lines 13a through 13h (in Embodiment 1, eight signal lines), which are connected to respective ones of the ports of the RFIC 12 at each of which ones of the ports a baseband signal is coupled. Each of the signal lines 13a through 13h is made of an electric conductor. Each of the signal lines 13a through 13h has a strip shape, and is provided in an inner layer of the substrate 11. The signal lines 13a through 13h are electrically connected to the respective ones of the ports of the RFIC 12, through respective vias 19a through 19h. For example, as illustrated in (b) of FIG. 2, the signal line 13d is electrically connected to a corresponding one of the ports of the RFIC 12 through the via 19d. Note that (a) of FIG. 2 omits the vias through which the signal lines 13a through 13h of the signal line group 13 are connected to the respective ones of the ports of the RFIC 12.

The ground layer 15 is a conductor film which is provided on the second main surface of the substrate 11. The second main surface is opposite to the first main surface of the substrate 11 on which first main surface the RFIC 12 is mounted. The ground layer 15 is provided in a first region of the second main surface of the substrate 11, which first region covers a second region of the inner layer of the substrate 11, in which second region the signal line group 13 is provided. The ground layer 15 is provided so as to extend to the edge 11a of the substrate 11. Note that the ground layer 15 is not provided in a vicinity of a region of the second main surface of the substrate 11 in which region the probe 16 is provided so that the leading end 16a of the probe 16 is not prevented from being coupled to the end part 32a of the waveguide.

The ground layer 15 thus configured is electrically conductive to pins of the card-edge connector 23 (later described) which pins are located in a negative direction of a y axis (see a pin 25d illustrated in (b) of FIG. 2). The pin 25d being grounded causes the ground layer 15 to be grounded.

The signal lines 13a through 13h of the signal line group 13 and the ground layer 15 form microstrip lines each of which is one aspect of the transmission line. Through each of the transmission lines, a baseband signal and a control signal are transmitted from the RFIC 12 to the baseband IC 22 (later described) or from the baseband IC 22 to the RFIC 12. Embodiment 1 will be described on the premise that a baseband signal is transmitted through a transmission line formed by the signal line 13d and the ground layer 15. Note that one or more of the signal lines 13a through 13h of the signal line group 13 can be grounded. Note also that the microstrip lines are employed each as the transmission line in Embodiment 1, but coplanar lines can be alternatively employed.

Note that, in Embodiment 1, the substrate 11 includes, as the inner layer, a single wiring layer in which the signal line group 13 is provided. However, the number of wiring layers included in the substrate 11 as the inner layer is not limited to one (1). That is, the substrate 11 can include, as the inner layer, a plurality of wiring layers.

The card-edge connector terminal group 14 is made up of a plurality of terminals, that is, the terminals 14a through 14h (in Embodiment 1, eight terminals). Each of the terminals 14a through 14h is a conductor pad made of a conductor film having a rectangular shape. When the edge 11a of the substrate 11 is inserted in a slot of the card-edge connector 23, the terminals 14a through 14h become electrically conductive to respective pins of the card-edge connector 23 which pins are located in a positive direction of the y axis (see a pin 24*d* illustrated in (b) of FIG. 2). The terminals 14*a* through 14*h* are electrically connected to the respective signal lines 13*a* through 13*h* through respective vias 20*a* through 20*h*. For example, in (b) of FIG. 2, the terminal 14*d* is connected to the signal line 13*d* through the via 20*d*. Note that (a) of FIG. 2 omits the vias through which the signal lines 13*a* through 13*h* of the signal line group 13 are connected to the respective terminals 14*a* through 14*h* of the card-edge connector terminal group 14.

A baseband signal and a control signal are (i) supplied from the baseband IC 22, which is mounted on the substrate 21, to each of the terminals 14*a* through 14*h* of the card-edge connector terminal group 14 thus configured or (ii) supplied from each of the terminals 14*a* through 14*h* of the card-edge connector terminal group 14 to the baseband IC 22, in a state where the edge 11*a* of the substrate 11 is inserted in the slot of the card-edge connector 23.

This allows the RFIC 12 to transmit and receive the baseband signal and the control signal to and from the baseband IC 22, via the signal line group 13 and the card-edge connector terminal group 14.

(Thermal Diffusion Plate 41, 42)

Each of the thermal diffusion plates 41 and 42 is a metal member having a plate shape. Metal, of which each of the thermal diffusion plates 41 and 42 is made, preferably has a high thermal conductivity. The radio communication device 1 employs the thermal diffusion plates 41 and 42 each made of aluminum. Note, however, that each of the thermal diffusion plates 41 and 42 can be made of, for example, copper.

A region of the substrate 11, which region includes the RFIC 12 and the probe 16, is sandwiched between the thermal diffusion plates 41 and 42 (see (b) of FIG. 1). The RFIC 12 is a circuit which processes a high frequency signal in the millimeter wave band, and the probe 16 is a member through which the high frequency signal is transmitted. In the radio communication device 1, each of the RFIC 12 and the probe 16 is a member whose heat release value is, above all, large. Since the RFIC 12 and the probe 16 are sandwiched between the thermal diffusion plates 41 and 42, the thermal diffusion plates 41 and 42 each function as a kind of heat sink. With the configuration, it is possible to suppress a risk of a failure in the radio communication device 1 which failure is caused by high heat.

Additionally, the thermal diffusion plate 41 has a circular through-hole 41*a* which is located so as to correspond to the leading end 16*a* of the probe 16. A diameter of the through-hole 41*a* is set so as to be identical to an outer diameter of the waveguide 32 or so as to be slightly smaller than the outer diameter of the waveguide 32. Therefore, by inserting (for example, press-fitting) the waveguide 32 in the through-hole 41*a*, the end part 32*a* of the waveguide 32 is fixed to the thermal diffusion plate 41.

A relative positional relationship between the substrate 11 and the thermal diffusion plate 41 is set so that a line extending from a central axis of the waveguide 32 touches the leading end 16*a* of the probe 16. In other words, the through-hole 41*a* is provided and located so as to correspond to the leading end 16*a* of the probe 16.

Here, how to fix the substrate 11 with use of the thermal diffusion plates 41 and 42 will be described with reference to FIG. 3.

The substrate 11 has two through-holes 11*b*. The thermal diffusion plate 41 has four through-holes 41*b*. The thermal diffusion plate 42 has four through-holes 42*b*. An inner wall of each of the two through-holes 11*b* and the four through-holes 41*b* is not threaded. In contrast, an inner wall of each of the four through-holes 42*b* is threaded. In view of the above, the four through-holes 42*b* will be hereinafter referred to as threaded holes 42*b*.

As illustrated in FIG. 3, the thermal diffusion plate 41, the substrate 11, and the thermal diffusion plate 42 are stacked in this order. After the four through-holes 41*b*, the two through-holes 11*b*, and the threaded holes 42*b* are approximately brought into alignment, screws 43 are tightened. This causes (i) the substrate 11 to be sandwiched between the thermal diffusion plates 41 and 42 and (ii) a location of the waveguide 32 relative to the substrate 11 to be fixed.

Note that a region R1 (see FIG. 3) is obtained by projecting an external shape of the waveguide 32. Locations of the two through-holes 11*b* on the substrate 11 are set so that the leading end 16*a* of the probe 16 is approximately in alignment with a center of the region R1.

Furthermore, a diameter of each of the two through-holes 11*b* and a diameter of each of the four through-holes 41*b* are each set so as to be slightly larger than a diameter of each of the screws 43. It is therefore possible to suppress a conversion loss at the part in which the leading end 16*a* is electromagnetically coupled to the end part 32*a* (converting section), by (i) finely adjusting a location of the substrate 11 and a location of the thermal diffusion plate 41 so that the central axis of the waveguide 32 touches the leading end 16*a* of the probe 16 and (ii) tightening the screws 43.

The thermal diffusion plate 42 has a depressed part 42*a* in which the RFIC 12 and part of the probe 16 are housed. The depressed part 42*a* is filled with a thermally conductive member 17 (see (b) of FIG. 1). The thermally conductive member 17 is an adhesive or a resin paste made of a silicone resin, an epoxy resin, or the like. A space between a surface of the RFIC 12 and an inner wall of the depressed part 42*a* is filled with the thermally conductive member 17. This causes an increase in thermal contact between the RFIC 12 and the thermal diffusion plate 42. That is, the thermally conductive member 17 causes an increase in thermal conductivity between the RFIC 12 and the thermal diffusion plate 42, and ultimately causes an increase in heat releasing efficiency of the thermal diffusion plate 42. Note that FIG. 3 omits, for convenience, the thermally conductive member 17.

(Housing 51)

Consequently, the thermal diffusion plate 42 is fixed to the housing 51. This allows the thermal diffusion plates 41 and 42 to absolutely hold the substrate 11 and the waveguide 32 so that (i) the region of the substrate 11 in which region the RFIC 12 is mounted is located along an x-y plane and (ii) the central axis of the waveguide 32 is located along a direction of a z axis.

With the configuration, it is possible to hold the waveguide 32 and the substrate 11 in the housing 51 so that the leading end 16*a* of the probe 16 is absolutely coupled to the end part 32*a* of the waveguide 32. Therefore, even in a case where the radio communication device 1 is used over a long term in a severe environment, it is possible to suppress unstable change in gain of the antenna.

A material of which the housing 51 is made is not limited to any particular one. However, in terms of strength, durability, and the like, the housing 51 is preferably made of metal.

(Substrate 21)

The substrate 21 is made of a dielectric material, and may or may not be flexible. Embodiment 1 illustrates that the substrate 21 is made of a glass epoxy resin and is not flexible. Note that the dielectric material of which the substrate 21 is made is not limited to a glass epoxy resin, and can be, for example, a polyimide resin.

The baseband IC 22, which processes a baseband signal, is mounted on the substrate 21. A band of the baseband signal is lower than that of a high frequency signal processed by the RFIC 12. The dielectric material of which the substrate 21 is made can be selected, as appropriate, depending on the band of the baseband signal.

In a case where the radio communication device 1 is a radio transmitter, the baseband IC 22 encodes, into a baseband signal, a data signal which is externally supplied via the waveguide 61, and then supplies the baseband signal thus encoded to the RFIC 12. In a case where the radio communication device 1 is a radio receiver, the baseband IC 22 decodes, into a data signal, a baseband signal which is supplied from the RFIC 12, and then supplies the data signal thus decoded outward via the waveguide 61. Note that, as has been described, the radio communication device 1 can be a radio transmitter, a radio receiver, or a radio transmitter-receiver. In a case where the radio communication device 1 is intended to function as a radio transmitter-receiver, the baseband IC 22 can employ, for example, time-division multiplexing. Note that the baseband IC 22 supplies, to the RFIC 12, the baseband signal together with a control signal for controlling the RFIC 12.

The card-edge connector 23 is mounted on the substrate 22. The card-edge connector 23 is electrically connected to ones of ports of the baseband IC 22 at which ones of the ports a baseband signal is coupled. A housing of the card-edge connector 23 is made of a resin, and is shaped in the form of a rectangular parallelepiped. The housing of the card-edge connector 23 is preferably made of a cured LPC. This allows a thermal expansion coefficient of the substrate 11 to be substantially identical to that of the card-edge connector 23. It is therefore possible to easily increase resistance of (i) the card-edge connector terminal group 14 and (ii) the card-edge connector 23 to a temperature change outside the radio communication device 1.

The housing of the card-edge connector 23 has a slit which is engraved in a negative direction of the z axis (see (b) of FIG. 2). The slit accommodates the edge 11a of the substrate 11 and the vicinity of the edge 11a. The housing of the card-edge connector 23 includes therein pins 24a through 24h and pins 25a through 25h. The pins 24a through 24h correspond to the respective terminals 14a through 14h, and the pins 25a through 25h correspond to the ground layer 15.

In a state where the edge 11a of the substrate 11 is inserted in the slot of the card-edge connector 23, (i) the pins 24a through 24h are electrically conductive to the respective terminals 14a through 14h and (ii) the pins 25a through 25h are electrically conductive to the ground layer 15.

Note that, in addition to the baseband IC 22, an electronic component, such as a capacitor or a quartz oscillator, which is necessary for operation of the baseband IC 22 can be mounted on the substrate 21.

(Supplementary Note)

According to the radio communication device 1, the substrate 11, for transmission and reception of the high frequency signal in the millimeter wave band, is caused to be flexible. Furthermore, according to the radio communication device 1, a point contact connection is employed between the card-edge connector terminal group 14 and the card-edge connector 23, so that the substrate 11 is electrically connected to the substrate 21. This makes it unnecessary to form, on the substrate 11, solder for connecting the substrate 11 to the substrate 21. It is therefore possible to prevent a wire from being broken while the substrate 11 is connected to the substrate 21, so that it is possible to realize the radio communication device 1 which is easily maintained.

A dimension of the card-edge connector terminal group 14 and a dimension of the card-edge connector 23 are each large, for example, approximately several centimeters. It is therefore easy to electrically connect the substrate 11 to the substrate 21 by employing the point contact connection. Note, however, that a frequency of a baseband signal is several MHz or more and several GHz or less. This means that, in a case where such a baseband signal is transmitted with use of a coaxial cable, a diameter of the coaxial cable is approximately 10 mm. It is therefore not easy to electrically connect the substrate 11 to the substrate 21 with use of such a coaxial cable.

The card-edge connector terminal group 14 includes the terminals 14a through 14h each of which is formed by printed wiring, and is not formed in the form of a connector. According to the point contact connection between the card-edge connector terminal group 14 and the card-edge connector 23, it is therefore less likely for breaking of a wire or a poor connection to occur between the card-edge connector terminal group 14 and the card-edge connector 23, as compared with connection with use of the coaxial cable. Moreover, according to the point contact connection, connected parts of the substrate 11 and the substrate 21 are put together in one place. This enhances reliability of connection, and causes a reduction in the number of steps required for the connection.

In a case of the point contact connection between the card-edge connector terminal group 14 and the card-edge connector 23, an area of each of the connected parts is larger, as compared with the connection with use of the coaxial cable. Therefore, a stress, applied to the connected parts during maintenance or adjustment of the radio communication device 1, is scattered. It is therefore less likely to cause a breakage of a solder (not illustrated) formed to the card-edge connector 23.

Since the halfway part of the substrate 11 is flexible, it is possible to bend the substrate 11 in the halfway part. This allows the card-edge connector terminal group 14 to be directly inserted in the card-edge connector 23. Furthermore, with the configuration, it is possible to insert or remove the card-edge connector terminal group 14 in or from the card-edge connector 23, even in a state where the region of the substrate 11 which region includes the RFIC 12 and the probe 16 is sandwiched between the thermal diffusion plates 41 and 42. Therefore, the substrate 11 allows the radio communication device 1 to be more easily maintained.

By employing an LCP, which has a low dielectric constant and a low dielectric dissipation factor, as a material of the base material of the substrate 11, it is possible to form the probe 16 on the substrate 11 by a well-known production process which is used in the field of FPC. This consequently allows a reduction in loss of an electromagnetic wave at the probe 16.

[Variation]

Figure 4:
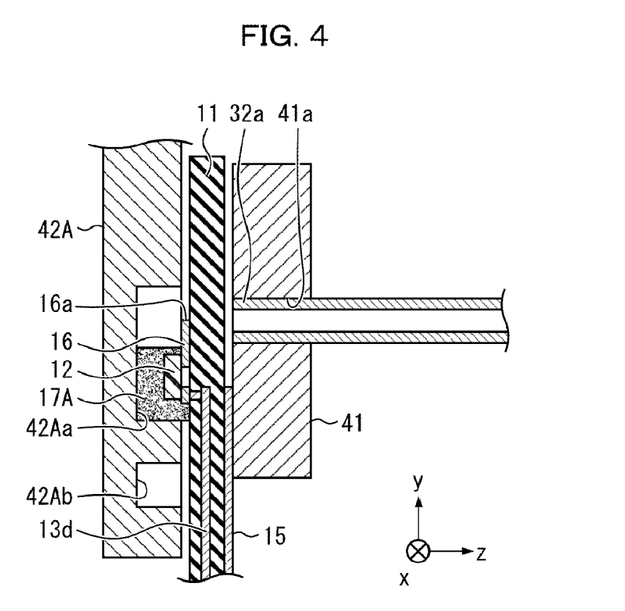
FIG. 4 is an enlarged cross-sectional view of a radio communication circuit, included in a radio communication device in accordance with a variation of the radio communication device illustrated in FIG. 1, and a vicinity of the radio communication circuit.

A variation of the radio communication device 1 will be described below with reference to FIG. 4. A radio communication device 1 in accordance with the present variation is obtained by replacing the thermal diffusion plate 42 (see (b) of FIG. 1) with a thermal diffusion plate 42A (see FIG. 4). Out of members included in the radio communication device 1 in accordance with the present variation, members other than the thermal diffusion plate 42A are identical to those included in the radio communication device 1 illustrated in FIG. 1.

The thermal diffusion plate 42A differs from the thermal diffusion plate 42, in size (size of an opening) of a depressed part 42A*a* in which an RFIC 12 and a probe 16 are housed. The depressed part 42*a* of the thermal diffusion plate 42 is formed so as to house the RFIC 12 and part of the probe 16. In contrast, the depressed part 42A*a* of the thermal diffusion plate 42A is formed so as to house the RFIC 12 and the whole of the probe 16.

In this manner, the depressed part 42A*a* can have such a size as to house the RFIC 12 and the whole of the probe 16.

Furthermore, according to the variation, the thermally conductive member 17A is filled in the depressed part 42A*a* (i) so as to cover a surface of the RFIC 12 and part of the probe 16 and (ii) so as not to cover a leading end 16*a* of the probe 16. In a case where a loss of a high frequency signal which loss is caused by a thermally conductive member being present at and in a vicinity of the leading end 16*a* should be avoided, it is preferable that the depressed part 42A*a* be filled with the thermally conductive member 17A as in the present variation.

Moreover, a depressed part 42A*b*, which is different from the depressed part 42A*a*, is further provided in the thermal diffusion plate 42A. The depressed part 42A*b* can be provided in any part of a surface of the thermal diffusion plate 42. For example, in a case where an electronic component, other than the RFIC 12, is mounted on a first main surface of the substrate 11, it is possible to house such an electronic component.

Embodiment 2

Figure 5:
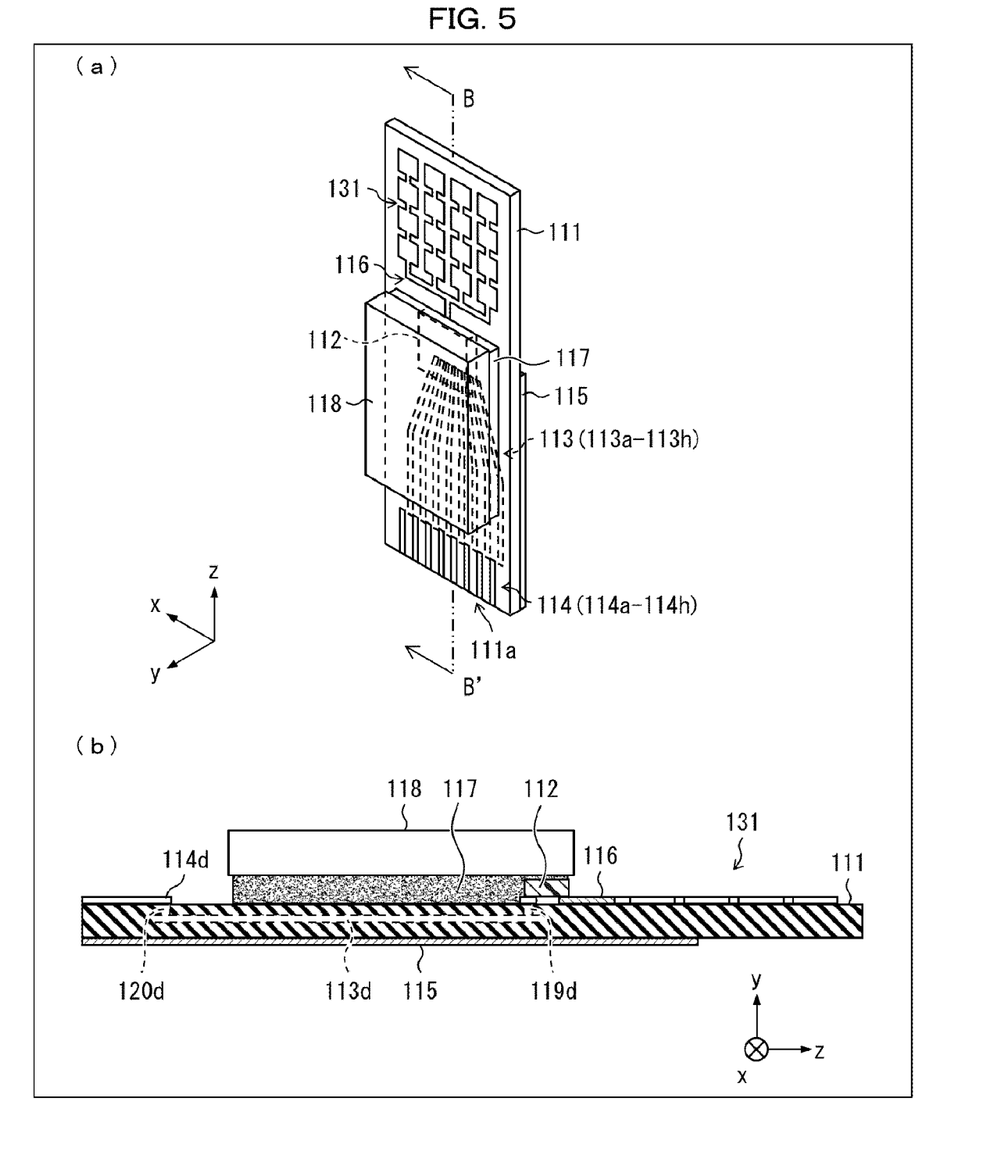

A substrate in accordance with Embodiment 2 of the present invention will be described below with reference to FIG. 5. (a) of FIG. 5 is a perspective view of a substrate 111 in accordance with Embodiment 2. (b) of FIG. 5 is a cross-sectional view of the substrate 111. (b) of FIG. 5 illustrates a cross-sectional view taken from a line B-B' illustrated in (a) of FIG. 5.

The substrate 111 in accordance with Embodiment 2 is obtained by altering the substrate 11 included in the radio communication device 1 in accordance with Embodiment 1. Therefore, respective reference numerals of members of which the substrate 111 is composed are obtained by adding hundred to the respective reference numerals of the members of which the substrate 11 is composed. For example, an RFIC 112, a signal line group 113, a card-edge connector terminal group 114, and a ground layer 115, of which the substrate 111 is composed, correspond to the RFIC 12, the signal line group 13, the card-edge connector terminal group 14, and the ground layer 15, respectively, of which the substrate 11 is composed. Vias 119*d* and 120*d* illustrated in (b) of FIG. 5 correspond to the vias 19*d* and 20*d*, respectively, illustrated in (b) of FIG. 2. Therefore, descriptions of those members will be omitted here.

As illustrated in FIG. 5, a slot array antenna 131, a feed line 116, a thermally conductive member 117, and a heat sink 118 are further provided to the substrate 111, as compared with the substrate 11.

The feed line, connected to one of ports of the RFIC 112 at which one of the ports a high frequency signal is coupled, is extended in a direction away from the RFIC 112 (in a positive direction of a z axis), divided into four, and then further extended in the positive direction of the z axis.

The slot array antenna 131 is coupled to leading ends of respective four branched parts of the feed line 116. The slot array antenna 131 is one aspect of the antenna recited in Claims. As illustrated in (a) of FIG. 5, the slot array antenna 131 is configured such that 16 radiating elements are arranged in a matrix pattern of 4×4.

In an aspect of the present invention, the slot array antenna 131 can be thus provided on a surface of the substrate 111. For example, in a case where the radio communication device 1 is employed as a radio communication device for a macrocell, the radio communication device 1 which includes the substrate 11 and the antenna 31 can be suitably used. Since the antenna 31 includes the reflector 33, it is possible for the antenna 31 to radiate a highly directional radio wave. Therefore, the radio communication device 1 which includes the antenna 31 is suitable for long-distance communication. In a case where the radio communication device 1 is employed as a radio communication device for a microcell or a picocell, the radio communication device 1 which includes the substrate 111 on which the slot array antenna 131 is provided can be suitably used. Since the slot array antenna 131 is highly compatible with a beam forming technique, the slot array antenna 131 is suitable for communication with a number of communication apparatuses (mobile terminals). Note that the slot array antenna 131 is integrated on the substrate 111. Therefore, the radio communication device 1 which includes the slot array antenna 131 is easily made smaller in size. The radio communication device 1 which includes the slot array antenna 131 is suitable as a radio communication device for a microcell or a picocell, also in terms of the size.

As illustrated in (b) of FIG. 5, the heat sink 118 is a heat sink which is made of metal and which is provided so that the heat sink 118 is in thermal contact with a surface of the RFIC 112 which surface is opposite to the substrate 111 (located in a positive direction of a y axis). The heat sink 118 is adhered to the surface of the RFIC 112, via the thermally conductive member 117.

The heat sink 118 allows heat generated by the RFIC 112 to be dissipated into air. It is therefore possible to suppress a risk of a failure in the substrate 111 which failure is caused by high heat.

In a case where the RFIC 12 is viewed from above, the heat sink 118 is extended in a direction toward the card-edge connector terminal group 114 from the RFIC 112 (in a negative direction of the z axis). Therefore, the heat sink 118 covers at least part of transmission lines constituted by signal lines 113*a* through 113*h* of the signal line group 113 and the ground layer 115.

According to the heat sink 118 thus configured, it is possible to enlarge a surface area of the heat sink 118 without covering up the slot array antenna 131 provided on a surface of the substrate 111, that is, without causing a reduction in gain of the slot array antenna 131. It is therefore possible to efficiently dissipate, into air, heat generated by the RFIC 112. This ultimately allows a risk of a failure, caused by high heat, to be further suppressed.

Moreover, since the heat sink 118 is made of metal, it is possible to block off a radio wave. By causing the heat sink 118 to cover the at least part of the transmission lines, it is possible to prevent an external noise from being superposed on a baseband signal which is transmitted through each of the transmission lines.

A space between the heat sink 118 and the transmission lines (in other words, a space between the heat sink 118 and a first main surface of the substrate 111) is filled with the thermally conductive member 117 which causes the heat sink 118 to be in thermal contact with the transmission lines.

The heat sink 118 thus configured also allows (i) heat generated by the transmission lines to be dissipated into air and (ii) heat generated by the RFIC 112 to be dissipated into air. It is therefore possible to further suppress a risk of a failure in the substrate 111 which failure is caused by high heat.

The present invention is not limited to the embodiments, but can be altered by a skilled person in the art within the scope of the claims. The present invention also encompasses, in its technical scope, any embodiment derived by combining technical means disclosed in differing embodiments.

Aspects of the present invention can also be expressed as follows:

A radio communication device (1) in accordance with an aspect of the present invention is a radio communication device (1) including: a first substrate (11, 111) whose base material is a dielectric material and on which a radio communication circuit (RFIC 12, 112) is provided, the radio communication circuit (RFIC 12, 112) being a circuit for making a conversion between (i) a high frequency signal in a millimeter wave band and (ii) a baseband signal having a frequency lower than that of the high frequency signal; and a second substrate (21) on which a baseband circuit (baseband IC 22) for processing the baseband signal is provided, at least a halfway part of the first substrate (11, 111) being flexible, the first substrate (11, 111) including: a terminal (14*a* through 14*h*, 114*a* through 114*h*) which is provided in a vicinity of an edge (11*a*, 111*a*) of the first substrate (11, 111) and to which the baseband signal is supplied from the second substrate (21); and a transmission line (signal line group 13, 113 and ground layer 15, 115) through which the baseband signal is transmitted from the terminal (14*a* through 14*h*, 114*a* through 114*h*) to the radio communication circuit (RFIC 12, 112), the second substrate (21) including a card-edge connector (23) which is electrically connected to the baseband circuit (baseband IC 22) and which supplies the baseband signal to the terminal (14*a* through 14*h*, 114*a* through 114*h*).

According to the radio communication device, transmission of a baseband signal between the first substrate and the second substrate is realized by inserting the edge of the first substrate and the vicinity of the edge of the first substrate, in which vicinity the terminal is provided, into the card-edge connector, which is included in the second substrate, so that the first substrate and the second substrate are connected to each other.

External force applied to each of the first substrate and the second substrate so that the edge of the first substrate and the vicinity of the edge of the first substrate are inserted into the card-edge connector is merely external force acting along one linear axis. That is, external force acting in a direction of rotation is not applied to a junction between the card-edge connector and the second substrate. According to the above configuration, it is therefore possible to suppress a contact failure which can occur between the first substrate and the second substrate in a case where maintenance is repeatedly carried out.

The radio communication device in accordance with an aspect of the present invention is preferably arranged so as to further include an antenna (31) which includes a waveguide (32) and a reflector (33), the first substrate (11) further including a probe (16) through which the high frequency signal is fed to the antenna (31), one (32*a*) of end parts of the waveguide (32) being electromagnetically coupled to a leading end (16*a*) of the probe (16), the other (32*b*) of the end parts of the waveguide (32) being electromagnetically coupled to the reflector (33).

The radio communication device can thus include an antenna which includes a waveguide and a reflector.

The radio communication device (1) in accordance with an aspect of the present invention is preferably arranged so as to further include: a housing (51) in which the first substrate (11), the second substrate (21), and the one (32*a*) of the end parts of the waveguide (32) are housed; and a first metal member (41) and a second metal member (42) sandwiching a region of the first substrate (11) in which region the radio communication circuit (12) and the probe (16) are provided, a through-hole (41*a*) being formed in a location of the first metal member (41) which location corresponds to the leading end (16*a*) of the probe (16), through the through-hole (41*a*) the leading end (16*a*) of the probe (16) being electromagnetically coupled to the one (32*a*) of the end parts of the waveguide (32), at least one of the first metal member (41) and the second metal member (42) being fixed to the housing (51) so as to hold the first substrate (11).

The radio communication circuit is a circuit which processes a high frequency signal in the millimeter wave band, and the probe is a member through which the high frequency signal is transmitted. Therefore, in the radio communication device, each of the radio communication circuit and the probe is a member whose heat release value is, above all, large. By causing those members to be sandwiched between the first metal member and the second metal member, it is possible to cause the first metal member and the second metal member to function as a kind of heat sink. With the configuration, it is therefore possible to suppress a risk of a failure in the radio communication device which failure is caused by high heat.

Furthermore, according to the above configuration, it is possible to hold the waveguide and the first substrate in the housing so that the leading end of the probe is absolutely coupled to the one of the end parts of the waveguide. Therefore, even in a case where the radio communication device is used over a long term in a severe environment, it is possible to suppress unstable change in gain of the antenna.

Further, the radio communication device (1) in accordance with an aspect of the present invention is preferably arranged such that: one (42, 42A) of the first metal member (41) and the second metal member (42, 42A), which one is located on a side where the radio communication circuit (RFIC 12) is provided, has a depressed part (42*a*, 42A*a*) in which (i) the radio communication circuit (RFIC 12) and (ii) part or whole of the probe (16) are housed; and the depressed part (42*a*, 42A*a*) is filled with a thermally conductive member (17, 17A) which causes the radio communication circuit (RFIC 12) to be in thermal contact with the one (42*a*, 42A*a*) of the first metal member (41) and the second metal member (42, 42A).

It is possible to improve (i) thermal contact between the radio communication circuit and one of the first metal member and the second metal member which one is located on the side where the radio communication circuit is provided and (ii) thermal contact between the probe and the one of the first metal member and the second metal member. Therefore, it is possible to further suppress a risk of a failure in the radio communication device which failure is caused by high heat.

A substrate (11, 111) in accordance with an aspect of the present invention is a substrate (11,111) whose base material is a dielectric material, at least a halfway part of the substrate (11, 111) being flexible, on the substrate (11, 111) a radio communication circuit (RFIC 12, 112) being provided for making a conversion between (i) a high frequency signal in a millimeter wave band and (ii) a baseband signal having a frequency lower than that of the high frequency signal, the substrate (11, 111) including (i) a terminal (14a through 14h, 114a through 114h) which is provided in a vicinity of an edge (11a, 111a) of the substrate (11, 111) and to which the baseband signal is externally supplied and (ii) a transmission line (signal line group 13, 113 and ground layer 15, 115) through which the baseband signal is transmitted from the terminal (14a through 14h, 114a through 114h) to the radio communication circuit (12, 112).

The substrate in accordance with an aspect of the present invention brings about an effect similar to that brought about by the radio communication device in accordance with an aspect of the present invention.

The substrate (111) in accordance with an aspect of the present invention is preferably arranged so as to further include: an antenna (131) which is provided on a surface of the substrate (111); and a feed line (116) through which the high frequency signal is transmitted between the radio communication circuit (RFIC 112) and the antenna (131).

In this manner, the substrate can include (i) the antenna which is provided on the surface of the substrate and (ii) the feed line.

The substrate (111) in accordance with an aspect of the present invention is preferably arranged so as to further include a heat sink (118) which is made of metal and which is in thermal contact with the radio communication circuit (RFIC 112).

According to the above configuration, it is possible to dissipate heat, generated by the radio communication circuit, into air with use of the heat sink. Therefore, it is possible to further suppress a risk of a failure in the substrate which failure is caused by high heat.

Further, the substrate (111) in accordance with an aspect of the present invention is preferably arranged such that in a case where the radio communication circuit (RFIC 112) is viewed from above, the heat sink (118) is extended in a direction toward the terminal (114a through 114h) from the radio communication circuit (RFIC 112), and covers at least part of the transmission line (signal line group 113 and ground layer 115).

According to the above configuration, it is possible to enlarge a surface area of the heat sink without covering up the antenna provided on the surface of the substrate, that is, without causing a reduction in gain of the antenna. Therefore, it is possible to efficiently dissipate, into air, heat generated by the radio communication circuit, and possible to further suppress a risk of a failure caused by high heat.

Moreover, since the heat sink is made of metal, it is possible to block off a radio wave. By causing the heat sink to cover the at least part of the transmission line, it is possible to prevent an external noise from being superposed on the baseband signal transmitted through the transmission line.

Further, the substrate (111) in accordance with an aspect of the present invention is preferably arranged so as to further include a thermally conductive member (117) which is provided between the heat sink (118) and the transmission line (113, 115) and which causes the heat sink (118) to be in thermal contact with the transmission line (signal line group 113 and ground layer 115).

According to the above configuration, the heat sink also allows (i) heat generated by the transmission line to be dissipated into air and (ii) heat generated by the radio communication circuit to be dissipated into air. Therefore, it is possible to further suppress a risk of a failure in the substrate which failure is caused by high heat.

REFERENCE SIGNS LIST

1 Radio communication device
11, 111 Substrate (first substrate)
11a, 111a Edge
12, 112 RFIC (radio communication circuit)
13, 113 Signal line group
13a through 13h, 113a through 113h Signal line (constituting transmission lines together with a ground layer 15)
14, 114 Card-edge connector terminal group
14a though 14h, 114a through 114h Terminal
15, 115 Ground layer (constituting the transmission lines together with 13a through 13h)
16 Probe
16a Leading end
17, 117 Thermally conductive member
19, 20, 119, 120 Via group
19a through 19h, 20a through 20h, 119a through 119h, 120a through 120h Via
21 Substrate (second substrate)
22 Baseband IC (baseband circuit)
23 Card-edge connector
31 Antenna
32 Waveguide
32a End part (one of end parts)
32b End part (the other one of the end parts)
33 Reflector
33a Main reflector
33b Sub-reflector
41 Thermal diffusion plate
42 Thermal diffusion plate
51 Housing
116 Feed line
118 Heat sink
131 Slot array antenna

The invention claimed is:

1. A radio communication device comprising:
a first substrate whose base material is a dielectric material and on which a radio communication circuit is provided, the radio communication circuit being a circuit for making a conversion between (i) a high frequency signal in a millimeter wave band and (ii) a baseband signal having a frequency lower than that of the high frequency signal; and
a second substrate on which a baseband circuit for processing the baseband signal is provided,
at least a halfway part of the first substrate being flexible,
the first substrate including:
a terminal which is provided in a vicinity of an edge of the first substrate and to which the baseband signal is supplied from the second substrate; and
a transmission line through which the baseband signal is transmitted from the terminal to the radio communication circuit,
the second substrate including
a card-edge connector which is electrically connected to the baseband circuit and which supplies the baseband signal to the terminal,
wherein the radio communication device further comprises an antenna which includes a waveguide and a reflector,
the first substrate further including a probe through which the high frequency signal is fed to the antenna, one of end parts of the waveguide being electromagnetically coupled to a leading end of the probe, the other of the end parts of the waveguide being electromagnetically coupled to the reflector, and wherein the radio communication device further comprises a housing in which the first substrate, the second substrate, and the one of the end parts of the waveguide are housed, a first metal member and a second metal member sandwiching a region of the first substrate in which region the radio communication circuit and the probe are provided, a through-hole being formed in a location of the first metal member which location corresponds to the leading end of the probe, through the through-hole the leading end of the probe being electromagnetically coupled to the one of the end parts of the waveguide, at least one of the first metal member and the second metal member being fixed to the housing so as to hold the first substrate.

2. The radio communication device as set forth in claim 1, wherein:

one of the first metal member and the second metal member, which one is located on a side where the radio communication circuit is provided, has a depressed part in which (i) the radio communication circuit and (ii) part or whole of the probe are housed; and the depressed part is filled with a thermally conductive member which causes the radio communication circuit to be in thermal contact with the one of the first metal member and the second metal member.

3. A substrate whose base material is a dielectric material, at least a halfway part of the substrate being flexible, on the substrate a radio communication circuit being provided for making a conversion between (i) a high frequency signal in a millimeter wave band and (ii) a baseband signal having a frequency lower than that of the high frequency signal, said substrate comprising (i) a terminal which is provided in a vicinity of an edge of the substrate and to which the baseband signal is externally supplied, (ii) a transmission line through which the baseband signal is transmitted from the terminal to the radio communication circuit, and (iii) a heat sink which is made of metal and which is in thermal contact with the radio communication circuit, wherein, in a case where the radio communication circuit is viewed from above, the heat sink is extended in a direction toward the terminal from the radio communication circuit, and covers at least part of the transmission line.

4. A substrate as set forth in claim 3, further comprising:

an antenna which is provided on a surface of the substrate; and a feed line through which the high frequency signal is transmitted between the radio communication circuit and the antenna.

5. A substrate as set forth in claim 3, further comprising a thermally conductive member which is provided between the heat sink and the transmission line and which causes the heat sink to be in thermal contact with the transmission line.

* * * * *